(12) United States Patent
Drexler et al.

(10) Patent No.: US 7,576,576 B2
(45) Date of Patent: Aug. 18, 2009

(54) SWITCHABLE PLL CIRCUIT

(75) Inventors: Michael Drexler, Gehrden (DE); Ralf-Detlef Schaefer, Celle (DE)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 11/593,738

(22) Filed: Nov. 7, 2006

(65) Prior Publication Data

US 2007/0103214 A1     May 10, 2007

(30) Foreign Application Priority Data

Nov. 8, 2005     (EP)     ................................. 05110472

(51) Int. Cl.
*H03L 7/06*     (2006.01)
(52) U.S. Cl. ..................... 327/156; 327/147; 327/155; 327/157; 327/158
(58) Field of Classification Search ......... 327/147–159; 331/34
See application file for complete search history.

(56) References Cited

U.S. PATENT DOCUMENTS

| | | | | |
|---|---|---|---|---|
| 5,184,350 A | * | 2/1993 | Dara | ........................... 370/466 |
| 5,332,978 A | * | 7/1994 | Yabuki et al. | ................... 331/2 |
| 5,530,389 A | * | 6/1996 | Rieder | ......................... 327/156 |
| 5,629,651 A | * | 5/1997 | Mizuno | ....................... 331/34 |
| 6,204,732 B1 | | 3/2001 | Rapoport et al. | |
| 6,275,553 B1 | * | 8/2001 | Esaki | ......................... 375/371 |
| 2005/0083099 A1 | | 4/2005 | Lin | |
| 2006/0001494 A1 | * | 1/2006 | Garlepp et al. | .................. 331/2 |

FOREIGN PATENT DOCUMENTS

EP     0 509 706 A     10/1992

* cited by examiner

*Primary Examiner*—Lincoln Donovan
*Assistant Examiner*—John W Poos
(74) *Attorney, Agent, or Firm*—Robert D. Shedd; Jeffrey M. Navon

(57) ABSTRACT

An electronic circuit includes a first and a second PLL stage (PLL1, PLL2) that can be switched in parallel or in series depending on locking of the first one of the PLL circuits to an input signal (IN). When in parallel, only the second PLL circuit (PLL2) is actively supplying a clock signal to the output of the electronic circuit. The first PLL circuit (PLL1) continues trying to lock onto the input signal (IN). A lock detector (LD) monitors the locking status of the first PLL circuit (PLL1) to the input signal (IN) and, upon locking, sets switches (S1, S2) to couple the output of the first PLL circuit (PLL1) to the input of the second PLL circuit (PLL2), and to couple the output of the second PLL circuit (PLL2) to the input of the first PLL circuit (PLL1).

12 Claims, 4 Drawing Sheets

SWITCHABLE PLL CIRCUIT

This application claims the benefit, under 35 U.S.C. § 119 of European Patent Application 05110472.7 filed Nov. 8, 2005.

FIELD OF THE INVENTION

The invention relates to an electronic circuit including two PLL circuits which can be switched between different configurations. In particular, the invention relates to PLL circuits in which controlled oscillators have to be locked with respect to frequency and phase to an input clock.

BACKGROUND OF THE INVENTION

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Electronic circuits which are supplied an input signal at a certain clock frequency often need to process the received input signal in further processing stages. Therefore, fixed relationships between the clocks used inside the further processing stages and the input signal are required. A further requirement is that the clocks have a very low jitter, i.e., the very low fluctuations in frequency or phase. To this end the input signal is often supplied to a phase lock loop circuit, or PLL circuit, which synchronises a controllable oscillator with the input signal. One particular type of PLL circuits uses a temperature compensated voltage controlled oscillator (TCXO). TCXOs exhibit excellent temperature and jitter behaviour. Oscillators of this type, however, have a very small frequency pulling range, i.e. the output frequency of this type of oscillator only be changed within a small range around the nominal frequency. As a result, PLL circuits using TCXO oscillators have a very small locking range, i.e. the difference between the input signal frequency and the nominal frequency of the oscillator must not be very large. PLL circuits that have a larger locking range can be built using voltage controlled oscillators (VCXO), which have a larger pulling range. VCXOs, however, are less stable in frequency and phase compared to TCXOs and thus the output signal of a PLL circuit using VCXOs may have a higher amount of clock jitter compared to a PLL circuit using a TCXO.

SUMMARY OF THE INVENTION

It is, therefore, desirable to have a circuit that provides locking to an input signal, producing an output clock signal with low jitter while at the same time exhibiting a large locking range.

The invention suggests combining two PLL circuits having individual control stages, wherein one of the PLL circuits uses a TCXO and the other one uses a VCXO as an oscillator. The two PLL circuits are either used individually or in a cascaded manner, depending on the operating mode.

In a first operating mode the two PLL circuits are connected in a first configuration that provides a larger locking range. To this end the input signal is supplied to both, the first and the second PLL circuit. The first PLL circuit has a controllable oscillator that has a relatively small pulling range and attempts to lock onto the input signal in the known way. Controllable oscillators having a relatively small pulling range but good phase frequency and temperature stability are, for example, temperature controlled crystal oscillators, or TCXOs. The controllable oscillator of the first PLL circuit has, however, the capability of oscillating with a nominal frequency in case of the absence of an input signal. In this case the first oscillator acts as a clock master which provides an excellent jitter quality. Further, the controllable oscillator of the first PLL circuit has a very stable phase and frequency behaviour. The second PLL circuit has a controllable oscillator which has a relatively large pulling range compared to the controllable oscillator of the first PLL circuit. The controllable oscillator of the second PLL circuit is, for example, a voltage controlled crystal oscillator, or VCXO. In the following specification the terms VCXO and TCXO are used as synonyms for controllable oscillators having a large as a small pulling range, respectively. The second PLL circuit thus has a large a locking range. In this first operating mode it also attempts to lock onto the input signal. As the second PLL circuit has a larger locking range it is very likely that it will lock onto the input signal at first. A lock detector provides information about the locking state of the first PLL circuit which has a smaller locking range than the second PLL. When the first PLL circuit is locked on to the input signal the two PLL circuits are connected in a second configuration that provides improved jitter behaviour compared to the first configuration, while having a smaller locking range. This operating mode is also referred to in the following as a second operating mode. Whenever the lock detector determines that the first PLL circuit is not locked the two PLL circuits are again connected in the first configuration. In case no input signal is present at all the TCXO oscillator of the first PLL circuit is oscillating freely at its nominal frequency. The output signal of the first PLL circuit is then supplied to the second PLL circuit, which locks onto the output signal of the first PLL circuit. This operating mode is also referred to in the following as a third operating mode.

BRIEF DESCRIPTION OF THE DRAWINGS

The invention will be described in the following with reference to the drawing. In the drawing.

In the figures, same or similar elements are referenced with the same reference symbol.

DETAILED DESCRIPTION OF PREFERRED EMBODIMENTS

Figure 1:
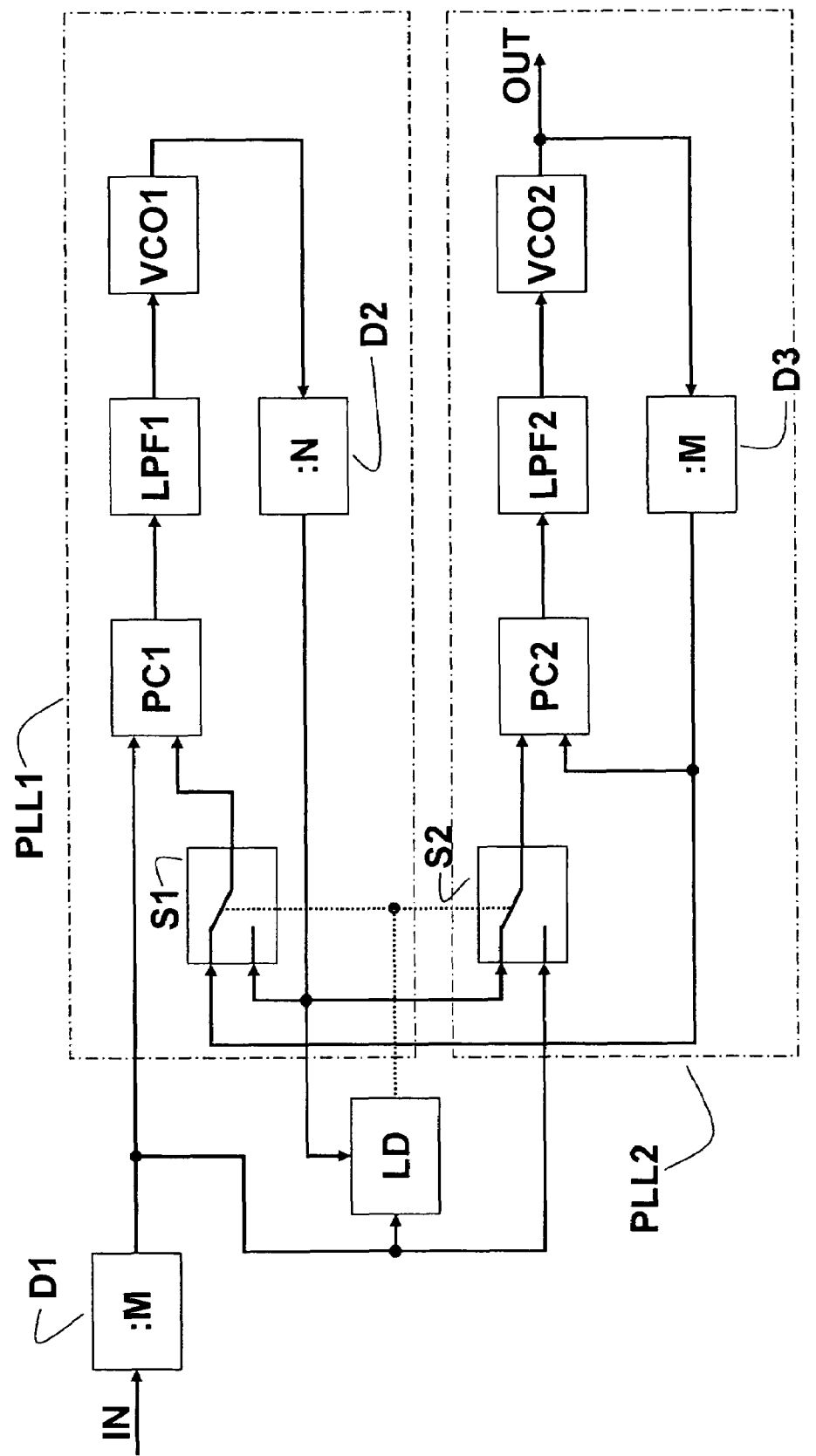
FIG. 1 shows a block diagram of the inventive circuit.

In FIG. 1 a block diagram of the inventive circuit is shown. An input signal IN is supplied via a first divider D1 to a first input of a first phase comparator PC1 of a first PLL circuit PLL1. To a second input of the first phase comparator PC1 an output signal of a first controllable oscillator VCO1 is supplied via a second divider D2 and a first switch S1. The first controllable oscillator VCO1 is controlled by the output signal of the first phase comparator PC1 which is supplied to the first controllable oscillator VCO1 via a first filter LPF1. The output signal of the first controllable oscillator VCO1 is further supplied to a lock detector LD, which also receives the input signal IN after division in the first divider D1. The lock detector LD controls the first switch S1, which selectively applies the output signal of the first controllable oscillator VCO1 or the output signal of a second controllable oscillator VCO2 to the second input of the first phase comparator PC1. The second controllable oscillator VCO2 is part of the second PLL circuit PLL2 and provides the output signal of the inventive circuit. The second PLL circuit PLL2 further includes a second phase comparator PC2 and a second filter LPF2. Like described for the first PLL circuit PLL1 the output signal of the phase comparator PC2 is applied to the second controllable oscillator VCO2 and via the second filter LPF2 for controlling the frequency of the output signal. The output signal is fed back to a first input of the second phase comparator PC2 via a third divider D3. A second switch S2 selectively applies the input signal IN downstream of the first divider D1 or the output signal of the first PLL circuit PLL1 to a second input of the second phase comparator PC2.

Figure 2:
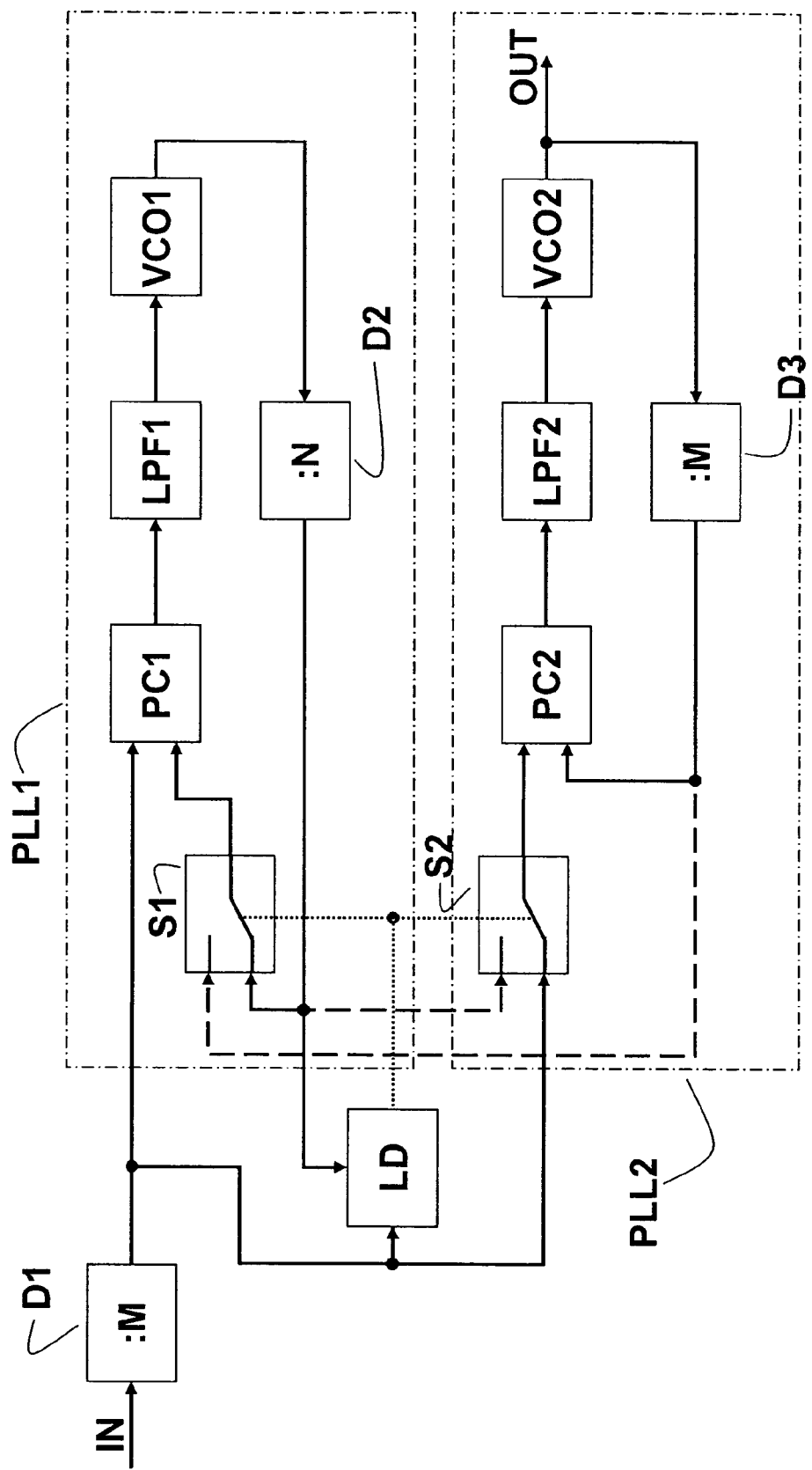
FIG. 2 shows a block diagram of the inventive circuit in a first operating mode.

FIG. 2 shows a schematic block diagram of the inventive circuit in a first operating mode. Solid lines indicate used connections carrying signals, while dashed lines indicate connections that are not used in this operating mode. An input signal IN is fed to a first input of a first phase comparator PC1 via a first divider D1. The output signal of the first phase comparator PC1 is filtered in a first filter LPF1 and controls a first controllable oscillator VCO1. The first controllable oscillator preferably is a TCXO. The output signal of the first controllable oscillator VCO1 is applied to a first selector switch S1 via a second divider D2. The first selector switch S1 is set to supply this signal to a second input of the first phase comparator PC1. The output signal of the first controllable oscillator VCO1 is also supplied to a lock detector LD which controls the first selector switch S1. The frequency-divided input signal IN is also supplied to the lock detector LD as well as to an input of a selector switch S2 which is set to apply this signal to a first input of a second phase comparator PC2. The selector switch S2 is likewise controlled by the lock detector LD. In this operating mode the two PLL circuits PLL1 and PLL2 that are formed by the respective components both try to lock onto the input signal IN. As the locking range of the second PLL circuit PLL2 is larger than that after first PLL circuit PLL1 the output signal of the inventive circuit will be locked rather quickly onto the input signal IN, however with a certain amount of jitter due to the properties of the second controllable oscillator VCO2. Despite the amount of jitter the output signal OUT of the inventive circuit is locked to the input signal IN. In case the frequency of the input signal IN lies in the locking range of the first PLL circuit PLL1 locking will occur. The lock detector detects the locking status of the first PLL circuit PLL1 and, upon detecting locking of the first PLL circuit PLL1 set the selector switches S1 and S2 accordingly to enter the second operating mode.

Figure 3:
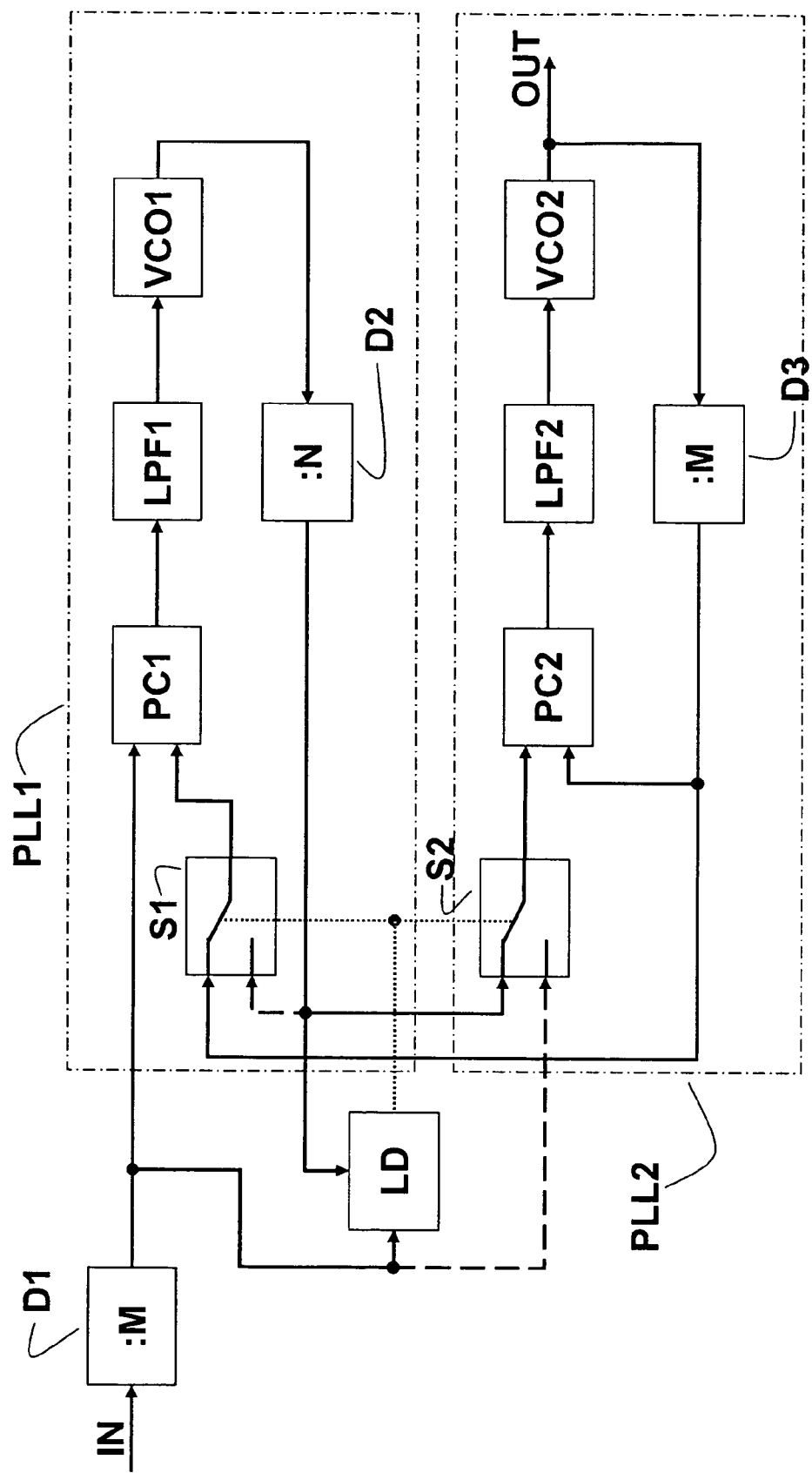
FIG. 3 shows a block diagram of the inventive circuit in a second operating mode.

In FIG. 3 a schematic block diagram of the inventive circuit in the second operating mode is shown. After detecting locking of the first PLL circuit PLL1 to the input signal IN the lock detector LD set the selector switches S1 and S2 to feed the output signal of the first PLL circuit PLL1 to the second phase comparator PC2 and the output signal of the second PLL circuit PLL2 to the first phase comparator PC1, respectively. The first PLL circuit PLL1 locked onto the input signal IN provides a very stable output signal having low jitter. The second PLL circuit PLL2 locks onto the stable output signal of the first PLL circuit PLL1.

Figure 4:
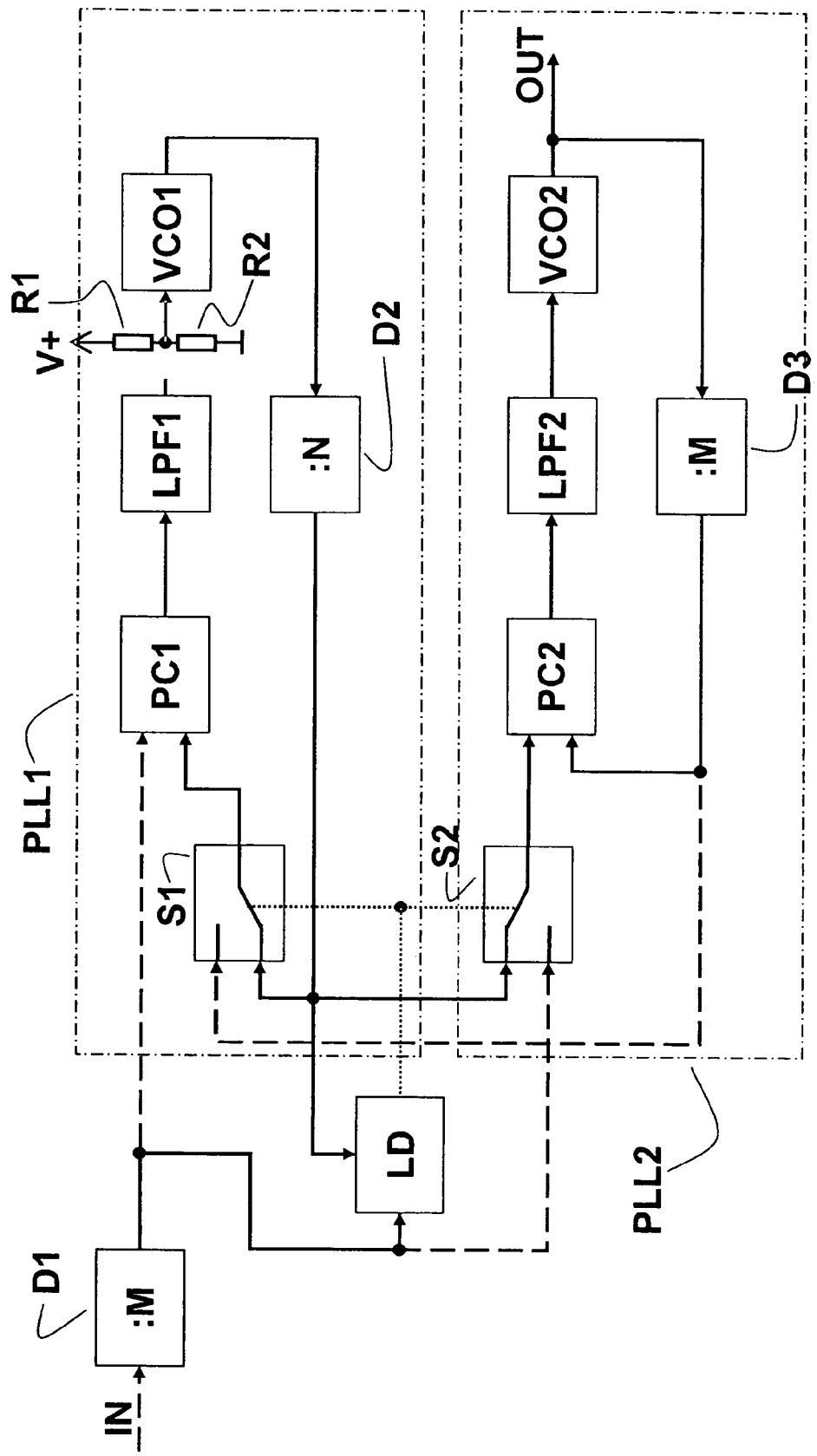
FIG. 4 shows a block diagram of the inventive circuit in a third operating mode.

In FIG. 4 a schematic block diagram of the inventive circuit in a third operating mode is shown. In this operating mode no input signal IN is present, and the first controllable oscillator VCO1 oscillates freely at its nominal frequency. The selector switch S2 is set to supply the output signal of the first controllable oscillator VCO1 to the second PLL circuit PLL2, which locks onto that signal, thereby providing a stable output frequency depending on the frequency of the first controllable oscillator VCO1. The output signal of the first controllable oscillator VCO1 is also supplied to the lock detector LD which also receives the input signal IN, if present. If the lock detector LD detects an input signal IN the selector switches S1 and S2 are set to enter the first operating mode. It is to be noted that the switch positions of the selector switches S1 and S2 may also be chosen to be similar to those of the second operating mode. In the third operating mode the first controllable oscillator VCO1 is disconnected from the first filter LPF1 and will oscillate at its nominal frequency. In one development the control input of the first controllable oscillator VCO1 is set to a predetermined level, e.g., by a resistor divider network R1, R2 between a supply voltage V+ and ground.

The divider ratios of the first and the second divider D1, D2, D3 are chosen according to the frequencies of the input signal IN and the oscillator frequencies of the first and the second controllable oscillator VCO1, VCO2.

It is to be noted that the first and the second divider D1, D2, D3 need not necessarily be present in the PLL circuit at all, depending on the input frequency range of the phase comparator. Further, depending on the way the phase comparator is built, the filter LPF1 need not necessarily be present at all in the PLL circuit.

In the specifications above the terms VCXO and TCXO have been exemplarily used in order to distinguish between controllable oscillators having different properties. It is to be noted that any of the letter having the respective properties can be used instead of those used in the specification.

The lock detector LD determines locking of the first PLL circuit PLL1 by evaluating the temporal distance of corresponding edges of the divided input signal IN and the output signal of the first PLL circuit PLL1 supplied to it. Corresponding edges are the rising or the falling edges of the two signals, respectively. As long as the temporal distance between the edges of the two signals changes PLL1 has not locked onto the input signal IN. Only if the temporal distance does not change, or if the change rate is below a predetermined value over a predetermined period of time, e.g. due to temperature drift, the PLL1 has locked onto the input signal IN and the lock detector changes over to the second operating mode.

One embodiment of the lock detector provides a counter that is started upon a first slope, either rising or falling, of a first signal out of the two signals applied to the lock detector LD. The counter is stopped in response to the corresponding slope of a second signal out of the two signals applied to the lock detector LD. The count value is stored and compared to subsequent count values. As long as the respective count values do not change, or change only at a predetermined, relatively small rate of change over a predetermined period of time, the status of the first PLL circuit PLL1 is considered to be locked.

When switching over between two of the different operating modes described above, the lock detector is, in one embodiment, inhibited for a predetermined period of time. This may be required due to transient behaviour of the oscillators and PLL circuits and the transients of the respective input signals.

The above the specification, examples and drawings provide a complete description of the manufacture and use of the composition of the invention. Since many embodiments of the invention can be made without departing from the spirit and scope of the invention, the invention resides in the claims herein after appended.

What is claimed is:

1. An electronic circuit with a first PLL circuit including a first phase comparator and a first controllable oscillator, with a second PLL circuit including a second phase comparator and a second controllable oscillator, wherein an input signal is supplied to an input of the first PLL circuit, wherein the input signal or the output of the first PLL circuit is selectively supplied to an input of the second PLL circuit, wherein either the output of the first PLL or the output of the second PLL circuit is selectively connected to an input of the first PLL circuit, wherein a lock detection circuit is provided which detects locking of the respective input signal to the output signal of the first controllable oscillator, wherein, in case the input signal is locked to the output signal of the first controllable oscillator, the output signal of the first PLL circuit is supplied to an input of the second PLL circuit and the output signal of the second PLL circuit is supplied to an input of the first PLL circuit, and wherein the output of the second PLL circuit is the single output of the circuit.

2. The electronic circuit of claim 1, wherein a first switch is provided for selectively connecting the output of the first or the second PLL circuit to an input of the first PLL circuit.

3. The electronic circuit of claim 1, wherein a second switch is provided for selectively connecting the output of the first PLL circuit or the input signal to an input of the second PLL circuit.

4. The electronic circuit of claim 1, wherein the first PLL circuit further includes a first filter and/or the second PLL circuit further includes a second filter.

5. The electronic circuit of claim 1 wherein the first controllable oscillator has a pulling range that is smaller than that of the second controllable oscillator.

6. The electronic circuit of claim 1, wherein frequency dividers are provided between the input terminal and the first phase comparator, the output of the first controllable oscillator and respective inputs of the first and the second switch, and/or the output of the second controllable oscillator and the respective inputs of the second phase comparator and the first switch.

7. A method for operating an electronic circuit including a first and a second PLL circuit including the steps of:

supplying an input signal to the inputs of the first and the second PLL circuit;

feeding back the signal of respective controllable oscillator's of the first and the second PLL circuit to respective first and second phase comparators of the respective first and second PLL circuit; and monitoring the lock status of the first PLL circuit with regard to the input signal in a lock detector supplying the output signal of the first PLL circuit exclusively to an input of the second PLL circuit, and the output signal of the second PLL circuit to an input of the first PLL circuit as the sole feedback signal, when the first PLL circuit is locked onto the input signal.

8. An electronic circuit with a first PLL circuit including a first phase comparator and a first controllable oscillator, with a second PLL circuit including a second phase comparator and a second controllable oscillator, wherein an input signal is supplied to an input of the first PLL circuit, wherein the input signal or the output of the first PLL circuit is selectively supplied to an input of the second PLL circuit, wherein either the output of the first PLL or the output of the second PLL circuit is selectively connected to an input of the first PLL circuit, wherein frequency dividers are provided between the input terminal and the first phase comparator, the output of the first controllable oscillator and respective inputs of the first and the second phase comparator, and/or the output of the second controllable oscillator and the respective inputs of the first and the second phase comparator, and wherein the output of the second PLL circuit is the single output of the circuit.

9. The electronic circuit of claim 8, wherein a first switch is provided for selectively connecting the output of the first or the second PLL circuit to an input of the first PLL circuit.

10. The electronic circuit of claim 8, wherein a second switch is provided for selectively connecting the output of the first PLL circuit or the input signal to an input of the second PLL circuit.

11. The electronic circuit of claim 8, wherein the first PLL circuit further includes a first filter and/or the second PLL circuit further includes a second filter.

12. The electronic circuit of claim 8, wherein the first controllable oscillator has a pulling range that is smaller than that of the second controllable oscillator.

* * * * *